United States Patent [19]

Haartsen

[11] Patent Number: 5,568,096
[45] Date of Patent: Oct. 22, 1996

[54] APPARATUS AND METHOD FOR USING NEGATIVE FM FEEDBACK IN HIGH QUALITY OSCILLATOR DEVICES

[75] Inventor: Jacobus Haartsen, Staffanstorp, Sweden

[73] Assignee: Telefonaktiebolaget LM Ericsson, Stockholm, Sweden

[21] Appl. No.: 424,079

[22] Filed: Apr. 19, 1995

[51] Int. Cl.$^6$ .................... H03C 3/00; H03L 7/02
[52] U.S. Cl. .................... 331/1 R; 331/105; 331/175; 332/123
[58] Field of Search .................... 331/1 R, 105, 331/175; 332/123, 126, 127, 128

[56] References Cited

U.S. PATENT DOCUMENTS

| | | | |
|---|---|---|---|
| 4,661,785 | 4/1987 | Benjaminson | 331/116 R |
| 4,788,512 | 11/1988 | Hogge, Jr. et al. | 331/4 |
| 4,792,768 | 12/1988 | Fried et al. | 331/11 |
| 5,170,130 | 12/1992 | Ichihara | 331/17 |
| 5,220,292 | 6/1993 | Bianchini et al. | 331/9 |
| 5,272,452 | 12/1993 | Adachi et al. | 331/17 |
| 5,311,149 | 5/1994 | Wagner et al. | 331/1 A |
| 5,331,293 | 7/1994 | Shepherd et al. | 331/1 R |
| 5,345,193 | 9/1994 | Bradley | 331/16 |

FOREIGN PATENT DOCUMENTS

| | | |
|---|---|---|
| 460958 | 12/1991 | European Pat. Off. . |
| 475262 | 3/1992 | European Pat. Off. . |
| 510710 | 10/1992 | European Pat. Off. . |
| 4241241 | 6/1994 | Germany . |
| WO89/00788 | 1/1989 | WIPO . |

OTHER PUBLICATIONS

H. Taub et al., "Threshold in Frequency Modulation", *Principles of Communication Systems*, Chap. 10, 1986, pp. 394–440; McGraw–Hill, N.Y.
A. G. van Nie, "Short–Term Stability of Harmonic Oscillators", *Philips Res. Repts.*, 25, 1970, pp. 437–451.
A. Bruce Carlson, "Communication Systems: An Introduction to Signals and Noise in Electrical Communication", p. 270, 1986, McGraw–Hill, N.Y.
Patent Abstracts of Japan, vol. 13, No. 62 (E–715), Feb. 1989 (JP–A–63 252003 Oct. 1988).

*Primary Examiner*—Siegfried H. Grimm
*Attorney, Agent, or Firm*—Burns, Doane, Swecker & Mathis, L.L.P.

[57] ABSTRACT

An apparatus and method are provided for increasing the effective Q-value of an oscillator so that the required Q-value can be reached with the use of a low Q-value oscillator. In this apparatus and method, the FM noise is measured at the output of the oscillator by an FM detector and the output of the FM detector is fed back to the control input of the oscillator. By using this negative FM feedback, frequency variations in the oscillator output are suppressed by applying a correction signal at the control input of the oscillator. The amount of suppression depends on the loop gain of the FM feedback loop and the amount of suppression is proportional to the loop gain so that the effective Q-value of the oscillator is proportional to the loop gain. As a result of correcting the FM noise measured at the oscillator output by using a negative FM feedback loop, the effective Q-value of the oscillator corresponds to the original Q-value multiplied by the loop gain of the FM feedback loop so that the effective Q-value of the oscillator is increased.

26 Claims, 2 Drawing Sheets

APPARATUS AND METHOD FOR USING NEGATIVE FM FEEDBACK IN HIGH QUALITY OSCILLATOR DEVICES

BACKGROUND

The present invention is directed to improving the stability of oscillating devices in applications such as communication systems which up or down convert signals in the transmitters and/or receivers and in frequency synthesizers where pure and stable frequency references are required. Other applications for the device and method of the present invention are in systems that require highly stable clock signals for reference purposes such as watches and computing devices and the device and method are also useful in any area where oscillators are applied.

Any system in which timing is important in some way has a local oscillator and many systems also require accurate frequency references that are generated locally. For instance, radio would not be possible without a local oscillator in the transmitter and receiver for converting the information signals to the proper frequency bands. The performance of these systems is highly dependent on the stability of the frequency provided by the oscillator. Phase jitter (phase noise) in the output of the oscillator limits the accuracy of the reference and therefore limits the accuracy of the entire system. Amplitude variations in the output of the oscillator are important as well in many applications but these amplitude variations can be readily suppressed with a limiter or an automatic gain control.

The general structure for high performance oscillators includes an amplifier which has its output fed back to its input via a resonating structure. The resonating structure produces a large output change when the frequency in the feedback loop varies and this output change opposes the frequency variations so that the frequency variations are minimized. As the change in the resonator output on a frequency variation becomes larger, the correction also becomes stronger. The resonator change with frequency is indicated by a quality or Q-value. A higher Q-value indicates that the resonator is more sensitive to frequency variations and therefore the ultimate oscillator output frequency will be more stable. In order to provide oscillators having pure and stable frequency outputs, low noise and high Q-values are required for the oscillator. High Q-values in the resonating structures for stable oscillators are essential because the final output spectrum of the oscillator is determined by the noise generated in the loop and the Q-value of the resonator.

High Q-value resonators are typically made with piezoelectric crystals which provide a steep phase change at a specific frequency. Ceramic resonators can also be applied that resonate at a frequency related to their physical dimensions or at a lower frequency where the resonators exhibit inductance characteristics. Furthermore, LC resonators (coils in combination with capacitors) can be used. In addition to the fact that crystal resonators can only be used up to relatively low frequencies, all of these resonator types are not suitable to be integrated with the electronics on an IC chip and these resonator types use discrete components as a result. Accordingly, integration of resonating components is very desirable to provide on-chip references to improve cost, performance and reliability of the devices. However, the only resonator type that may be possibly used for chip integration is the LC structure. Nevertheless, standard IC processes provide low Q-value coils (high series resistance), which limits the Q-value of the LC structure resonator, and therefore, does not allow for integration of high Q-value oscillators.

An oscillator can be modeled as a noise filter with an extremely small bandwidth and therefore the output spectrum of the oscillator can be considered as narrowband noise. This noise can be split into amplitude or AM noise, and phase (PM) or frequency (FM) noise. The AM noise can be suppressed by using an automatic gain control (AGC) or a limiter in the feedback loop. However, FM noise depends on the correction capabilities of the resonator in the feedback loop or on the Q-value of the resonator. When AM noise is removed at the oscillator output, only FM noise remains and the oscillator can be modeled as an ideal oscillator (having an infinite Q-value) with a noisy signal on its frequency control input. Noise at the control input provides an FM modulation of the oscillator output similar to a non-ideal oscillator output.

FIG. 1 illustrates the configuration for a typical oscillator where an amplifier 10 is fed back by a passive, phase rotating network 20. The oscillator 5 starts to oscillates at the frequency for which the Barkhausen conditions are fulfilled where the loop gain is exactly 1 and the loop phase is 0 or $2\pi$. The oscillator 5 is preferably designed such that the phase condition occurs in the steepest part in the phase characteristics of the network 20. More precisely, the Q-value of the network 20 is related to the phase derivative, or group delay $\delta\phi/\delta f$ of the resonator according to:

$$Q = \left| \frac{1}{2} f_0 \frac{\delta\phi}{\delta f} \right| \qquad \text{EQUATION 1}$$

where $f_o$ is the resonating frequency in Hz.

The output spectrum of the oscillator 5 can be determined by modeling the oscillator 5 as an extremely narrow band filter that filters the noise in the feedback loop. The noise power spectral density at the output $S_v$, is thereby proportional to the whim noise density $S_n$ in the loop and inversely proportional to $Q^2$ of the resonating structure according to:

$$S_v = \frac{S_n}{v^2 Q^2} \; [V^2/Hz] \qquad \text{EQUATION 2}$$

where $v = f/f_o - f_o/f$.

When AM noise in the output spectrum is taken away in a known manner by applying an AGC or a limiter for example, only phase noise is left which can be modeled as FM modulation of a voltage controlled oscillator (VCO) 30 as illustrated in FIG. 2. As illustrated in FIG. 2, a non-ideal (low Q-value, noisy) oscillator can be represented by an ideal (infinite Q-value, noiseless) VCO 30 which has an equivalent noise source at its control input that produces the same noise spectrum at the output of the ideal VCO as the original, non-ideal oscillator would show. It is known to one skilled in the art of oscillator design to vary the frequency of an oscillator by controlling one of the components in the resonator. FIG. 3a illustrates an example of a parallel resonance circuit including a coil 40 and a capacitor 50. When the capacitance is made controllable by using a VARICAP or a varactor 55 as illustrated in FIG. 3b the resonance frequency at $1/(2\pi\sqrt{LC})$ is changed without affecting the Q-value of the resonator structure. The use of other resonator structures is possible as well such as structures with series resonance. By using narrowband FM analysis, the spectrum from equation 2 can be created from a whim noise source at the input of the VCO 30 having an equivalent noise voltage $u_n$ calculated by:

$$u_n = \sqrt{S_n} \times \frac{f_0}{K_{vco}} \times \frac{1}{Q} \quad [V/Hz^{1/2}] \qquad \text{EQUATION 3}$$

where $K_{vco}$ is the sensitivity of the VCO 30 in Hz/V.

When the oscillator is modeled as a VCO with a noise source at its input as illustrated in FIG. 2, the output phase noise can be reduced by applying negative feedback to the input of the VCO by measuring phase or frequency disturbances at the output of the VCO 30 and feeding these measured disturbances back to the input of the VCO 30. A known technique to compensate for phase disturbances is to lock the phase of a low Q-value VCO to a clean reference by the use of a phase locked loop (PLL) so that the low Q-value VCO will provide an output signal that is as pure as the reference within the PLL noise bandwidth. This can be considered as a negative PM feedback.

Another known technique for stabilizing the output of a direct digital frequency synthesizer is feeding back a demodulated output to the input of the direct digital frequency synthesizer as disclosed in U.S. Pat. No. 5,331,293 to Shepherd et al. This technique cancels out the jitter which corresponds to unwanted modulation caused by the operation of the digital synthesizer section. Also, a demodulator 118 develops a signal which is fed back to the clock for compensation as illustrated in FIG. 1. This compensation takes place on the clock 124 of the direct frequency synthesizer which is a VCO locked to a reference frequency by a PLL and this technique uses a complicated subtraction method for compensation.

Another known FM compensation technique is described in the text entitled "Communication Systems" by Carlson on page 270. In problem 7.3-2, Carlson discloses a direct FM generator including a VCO fed back with a signal derived from the FM detection of the VCO output. In this technique, the compensation removes DC offset and drift of the modulating signal by applying low pass filters in the loop.

Because it is desirable in many applications to increase the effective Q-value of an oscillator, careful design for the resonating structures of the oscillators is essential. Nevertheless, in chip integration, only low Q-value resonators can be processed. If there is a means to increase the effective Q-value of an oscillator, low Q-value resonators can be applied while producing high Q-value oscillators of low cost, high performance and high reliability.

SUMMARY

An object of the present invention is to provide an apparatus and method which increases the effective Q-value of an oscillator thus suppressing the frequency variations at the output of the oscillator.

Another object of the present invention is to improve the stability of an oscillating device by using a negative FM feedback loop which generates a correction signal which is derived directly from the output of the oscillating device.

These objects of the present invention are fulfilled by providing an apparatus for increasing the stability of an oscillating device comprising an FM detector for measuring FM noise output from the oscillating device and means for suppressing frequency variations at the output of the oscillating device in proportion to said FM noise measured by said FM detector. When suppressing the FM noise measured at the output of the oscillating device, with a correction signal input to the oscillating device, the effective Q-value of the oscillating device is increased and the frequency variations are suppressed. As a result, a low Q-value oscillating device may be used which is boosted to a higher effective Q-value for the desired application.

These objects of the present invention are also fulfilled by providing a method of stabilizing an oscillating device comprising the steps of measuring FM noise output from the oscillating device and suppressing frequency variations at the output of the oscillating device directly in proportion to the measured FM noise. This method increases the effective Q-value of the oscillating device by using a negative FM feedback loop in response to the measured FM noise so that the effective Q-value of the oscillator can be increased in proportion to the loop gain of the negative FM feedback loop.

Further scope of applicability of the present invention will become apparent from the detailed description given hereinafter. However, it should be understood that the detailed description and specific examples, while indicating preferred embodiments of the invention, are given by way of illustration only, since various changes and modifications within the spirit and scope of the invention will become apparent to those skilled in the art from this detailed description.

BRIEF DESCRIPTION OF THE DRAWINGS

The present invention will become more fully understood from the detailed description given hereinbelow and the accompanying drawings which are given by way of illustration only, and thus are not limitative of the present invention wherein.

DETAILED DESCRIPTION

Figure 1:
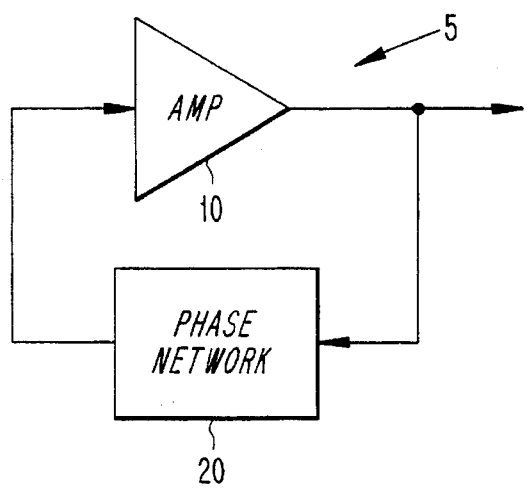
FIG. 1 illustrates a simplified model of a general oscillator.
Figure 2:
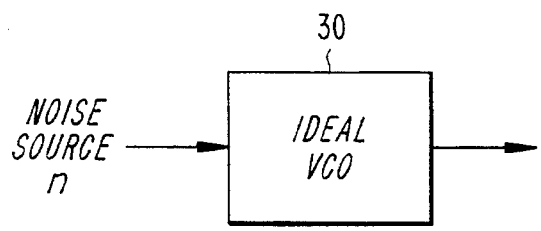
FIG. 2 illustrates the modeling of a non-ideal oscillator by an ideal VCO controlled by noise.
Figure 3A:
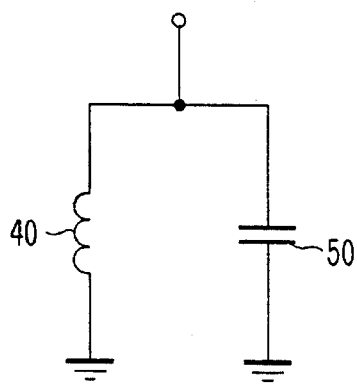
FIGS. 3a and 3b illustrate parallel resonance and tunable parallel resonance circuits, respectively.
Figure 3B:
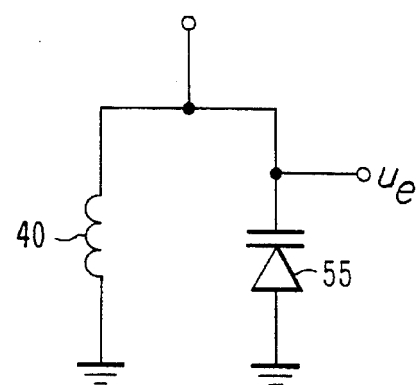
Figure 4:
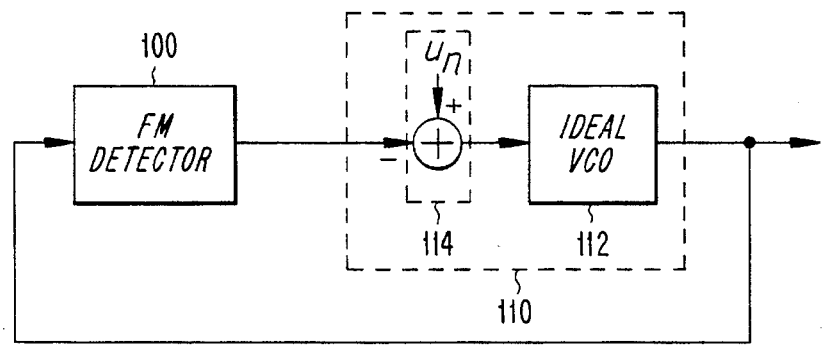
FIG. 4 illustrates an FM feedback oscillator used in an embodiment of the present invention.

An embodiment of the present invention for an FM feedback oscillator will be discussed with reference to FIG. 4. FIG. 4 illustrates the general concept of an FM feedback oscillator. The FM feedback oscillator includes an FM detector 100 and a non-ideal VCO 110 including an ideal VCO 112 and an adder and noise voltage source 114 for a noise signal $u_n$. This noise source 114 is a virtual or equivalent source that produces a noise spectrum at the output of the ideal VCO 112 which is identical to the noise spectrum of the non-ideal VCO 110. The input of the FM detector 100 is connected to the output of the VCO 110. The FM detector 100 measures the FM noise at the output of the VCO 110 and the output of the FM detector 100 is connected to the input of the VCO 110 for feeding back the measured FM noise to the VCO 110. The total loop gain must be negative, which can be accomplished by having either a negative VCO gain (i.e. a positive VCO input deviation gives a decrease of the output frequency), or a negative FM detector gain (i.e. a positive frequency deviation gives a negative output deviation). As a result, the equivalent noise signal seen at the input of the ideal VCO 112 is reduced from the original noise signal $u_n$ to a reduced noise signal $u_{n,eq}$. By considering the oscillator as the ideal VCO 112 with the adder and noise source 114 at its input, the output phase noise of the ideal VCO 112 can be reduced by applying negative feedback to the input of the ideal VCO 112. The feedback loop reduces the noise at the noise source 114 to the value $u_{n,eq}$ according to:

$$u_{n,eq} = \frac{u_n}{1 + K_{FM} \times K_{vco}} \qquad \text{EQUATION 4}$$

where $K_{FM}$ is the gain of the FM detector 100 in V/Hz.

Because the equivalent noise voltage at the input to the ideal VCO 112 is inversely proportional to the Q-value of the resonator (see Equation 3), the negative FM feedback effectively increases the Q-value of the oscillator according to the equation:

$$Q_{eff} = (1 + K_{FM} \times K_{vco}) Q \qquad \text{EQUATION 5}$$

In this FM feedback loop, the loop gain should be made as high as possible to obtain a high effective Q-value oscillator. The loop gain $-K_{FM} \times K_{vco}$ of the FM feedback loop suppresses any noise in the FM feedback loop in addition to the noise in the VCO output. Also, phase noise, which cannot be considered narrowband filtered noise such as 1/f or flicker noise, for example, or other noise injected at the oscillator output, such as cross-talk from other circuits, is suppressed as well. The FM feedback oscillator illustrated in the embodiment for FIG. 4 is sufficient for a high Q-value oscillator with a fixed resonance frequency. The frequency which stabilizes the FM feedback control is determined by the intersection point of the voltage-to-frequency and frequency-to-voltage curves of the VCO 110 and the FM detector 100, respectively. However, in most applications, an oscillator is desired that has a resonance frequency controlled by a voltage, either to correct for fabrication inaccuracies or to get intended frequency swings or hops during operation.

Figure 5:
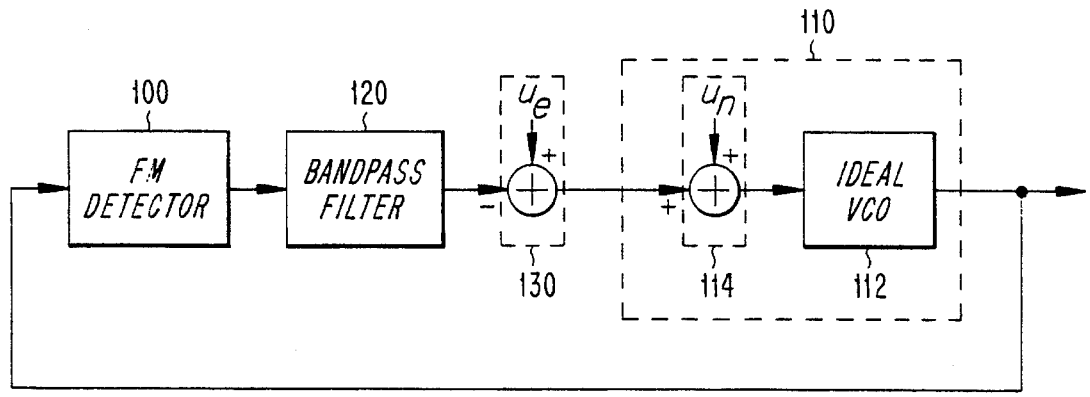
FIG. 5 illustrates a tunable FM feedback oscillator used in another embodiment of the present invention.

The FM feedback for the oscillator illustrated in FIG. 4 operates down to DC and this oscillator is difficult to tune because any change to the control input of the VCO is suppressed by the feedback loop. Accordingly, FIG. 5 illustrates another embodiment of the present invention where a tunable oscillator is provided whose resonance frequency is controlled by a voltage. Similar to the embodiment illustrated in FIG. 4, the tunable FM feedback oscillator of Figure 5 includes the FM detector 100, the non-ideal VCO 110 including the ideal VCO 112 and the noise source 114, a bandpass filter 120 and an adder and external control source 130. The bandpass filter 120 and the adder and external control source 130 are connected between the output of the FM detector 100 and the input to the non-ideal VCO 110. The bandpass filter 120 functions to prevent loop control in the lower frequency range so that the VCO 110 can be controlled by an external and slowly varying control signal $u_e$ input to the adder and external control source 130.

The frequency control of the oscillator is such that the bandpass filter 120 operates as a high-pass filter. The lower cut-off frequency of the bandpass filter 120 should be at the highest modulation frequency for the frequency control. Below this cut-off frequency, the loop gain is zero and no compensation takes place. In the present embodiment, the Q-value of the VCO 110 is increased in order to reduce the phase noise at a distance away from the carrier. The phase noise close to the carrier is usually not a problem. In applications of an indirect frequency synthesizer for example, the VCO 110 is locked to a reference frequency which stabilizes the output frequency of the VCO 110 within the PLL loop bandwidth or close to the carder. Outside the PLL bandwidth, the frequency is stabilized using the FM feedback compensation described in the embodiment of the present invention. The FM feedback should involve high pass filtering in order to avoid FM compensation within the PLL bandwidth where synthesis takes place.

In addition to the lower cut-off frequency in the loop band which provides tunability, the bandpass filter 120 is required to operate for filtering at the high end frequencies as well. When the output of the VCO 110 reaches the noise floor, the spectrum cannot be regarded as pure phase noise. The AM part of the noise cannot be represented by a noise source at the input to the VCO 110 and therefore this AM noise cannot be compensated. Due to the AM sensitivity of the FM detector 100, this AM noise produces FM noise. Although the FM noise is compensated by the loop again, it is better to prevent this FM noise from reaching the input to the VCO 110. Therefore, the bandpass filter 120 must have these bandpass characteristics. The high frequency cut-off should preferably be at a frequency off-set where the output spectrum of the uncompensated VCO 110 reaches the noise floor.

Figure 6:
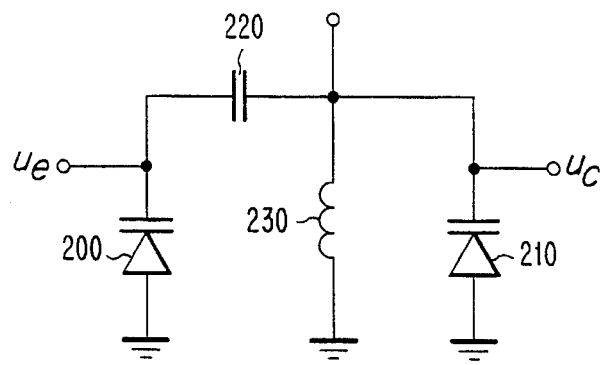
FIG. 6 illustrates a parallel resonance circuit having two control signals.

The tunable FM feedback oscillator contains an adder 130 to add the modulating signal to the VCO control signal. In fact, this addition can be done inside the VCO 110, which therefore has to have two control inputs. FIG. 6 illustrates an embodiment of the present invention for a parallel resonance circuit having dual controls. The parallel resonance circuit of FIG. 6 includes dual controls $u_e$ and $u_c$ and two VARICAPS or varactors 200 and 210 connected between the controls $u_e$ and $u_c$ and ground, respectively, a DC blocking capacitor 220 connected between the controls $u_e$ and $u_c$ and an inductor 230 connected in parallel to the varactors 200 and 210. The two control voltages $u_e$ and $u_c$ (the external tuning signal and the FM feedback compensation signal, respectively) directly control the two independent VARICAPS or varactors 200 and 210. When this parallel resonance circuit is used as a resonator in the VCO 110, the two control voltages $u_e$ and $u_c$ independently control the resonance frequency of the VCO 110.

The FM detector 100 is the essential component in the FM feedback oscillator for the embodiments of the present invention. The FM detector 100 is preferably a very low-noise circuit. The noise contribution of the FM detector should be well below the FM output signal which is in the order of the equivalent noise voltage $u_n$ as given in Equation 3. The requirements on the gain $K_{FM}$ and the FM detector 100 are not extremely high and the gain $K_{FM}$ is calculated by:

$$K_{FM} = \frac{K_{loop}}{K_{vco}} \qquad \text{EQUATION 6}$$

where $K_{loop}$ is a loop gain. If a Q-value increase by a factor 10 is required ($K_{loop}=10$) and a VCO gain of 10 MHz/V is required for example, then the required gain $K_{FM}=1$ μV/Hz. In the case that the FM detector 100 cannot attain this gain, a low-noise amplifier following the FM detector 100 or the bandpass filter (not shown) provides extra loop gain, i.e., $-G_a \times K_{FM} \times K_{vco}$ where $G_a$=the gain of the low-noise amplifier. The linearity of the detector 100 is not important because non-linearities in the loop gain will only slightly be reflected in the spectrum fall-off. The operation range of the FM detector 100 is determined by the external modulation of the VCO 110. Because the signal level of the compensated noise at the input of the VCO 110 is small, and thereby the instantaneous frequency deviations are relatively small, the instantaneous frequency deviations due to this noise signal are limited to a very small range.

The embodiments of the present invention are directed to measuring the FM noise at the oscillator output using an FM detector and feeding the output of the FM detector back to the control input of the oscillator. By using a negative FM feedback, the frequency variations in the output of the oscillator are suppressed by applying a correction signal at the control input of the oscillator. The amount of suppression depends on the loop gain of the negative FM feedback loop and the amount of suppression is proportional to the loop gain such that the effective Q-value of the oscillator is proportional to the loop gain. By correcting the FM noise measured at the oscillator output with a negative FM feedback loop, the effective Q-value of the oscillator is the original Q-value of the resonating structure multiplied by the loop gain of the FM feedback loop. As a result, a low Q-value oscillator can be used and this low Q-value of the oscillator may be boosted up to increase the effective Q-value of the oscillator for use in any application where the initial Q-value of the oscillator is not sufficient.

The invention being thus described, it will be obvious that the same may be varied in many ways. Such variations are not to be regarded as a departure from the spirit and scope of the invention, and all such modifications as would be obvious to one skilled in the art are intended to be included within the scope of the following claims.

What is claimed is:

1. An apparatus for increasing the stability of an output of an oscillating device while increasing a Q-value of the oscillating device comprising:
   an FM detector for measuring FM noise output from the oscillating device;
   suppressing means for suppressing frequency variations at the output of the oscillating device while increasing the Q-value by a correction signal generated directly from said FM noise output by the oscillating device and in proportion to said FM noise measured by said FM detector; and
   a bandpass filter connected to the output of said FM detector for preventing said suppressing means from applying said correction signal in a predetermined low frequency range.

2. An apparatus according to claim 1, wherein the oscillating device comprises a voltage controlled oscillator.

3. An apparatus according to claim 1, wherein the oscillating device comprises a current controlled oscillator.

4. An apparatus according to claim 1, wherein the oscillating device comprises an indirect frequency synthesizer.

5. An apparatus according to claim 1, wherein said correction signal increases the Q-value of the oscillating device by a factor of $(1+K_{FM} \times K_{vco})$ where $K_{FM}$=the gain of said FM detector and $K_{vco}$=the sensitivity of the controlled oscillating device.

6. An apparatus according to claim 1, further comprising a low noise amplifier for increasing the Q-value of the oscillating device with said correction signal by a factor of $(1+G_a \times K_{FM} \times K_{vco})$ where $G_a$=the gain of said low noise amplifier, $K_{FM}$=the gain of said FM detector and $K_{vco}$=the sensitivity of the oscillating device.

7. An apparatus according to claim 1, further comprising external control means for applying an external, slowly varying control signal to the oscillating device.

8. An apparatus according to claim 1, wherein said bandpass filter cuts off high frequencies at a frequency offset where an output spectrum of the oscillating device that is uncompensated reaches a noise floor.

9. An apparatus according to claim 1, further comprising a low noise amplifier connected to the output of said FM detector for achieving an increased loop gain which further increases the effective Q-value of the oscillating device.

10. An oscillating device comprising:
    an oscillator for outputting an FM modulation signal;
    a negative FM feedback loop for generating a loop gain which suppresses noise in said FM modulation signal in proportion to said loop gain by directly compensating said oscillator, wherein said negative FM feedback loop comprises an FM detector for measuring noise in said FM modulation signal which corresponds to said loop gain; and a filter connected to the output of said FM detector for causing said negative FM feedback loop to generate a loop gain which is substantially zero in a predetermined frequency range.

11. An oscillating device according to claim 10, wherein said negative FM feedback loop suppresses undesired frequency variations by generating a correction signal directly from an output of said oscillator and applying said correction signal to said oscillator.

12. An oscillating device according to claim 11, wherein said negative FM feedback loop increases the effective Q-value of said oscillator for a fixed resonance frequency.

13. An oscillating device according to claim 12, wherein the effective Q-value of said oscillator is increased by a factor of $(1+K_{FM} \times K_{vco})$ where $K_{FM}$=the gain of said FM detector and $K_{vco}$=the sensitivity of the controlled oscillator.

14. A method of stabilizing an output of an oscillating device while increasing a Q-value of the oscillating device comprising the steps of:
    (a) measuring FM noise output from the oscillating device by an FM detector;
    (b) suppressing frequency variations at the output of the oscillating device while increasing the Q-value by generating a correction signal directly from said FM noise output from the oscillating device and in proportion to said FM noise measured at said step (a); and
    preventing said correction signal from being applied in a predetermined low frequency range at said step (b) by a bandpass filter connected to the output of said FM detector.

15. A method according to claim 14, wherein the oscillating device comprises a voltage controlled oscillator.

16. A method according to claim 14, wherein the oscillating device comprises a current controlled oscillator.

17. A method according to claim 14, wherein the oscillating device comprises an indirect frequency synthesizer.

18. A method according to claim 14, wherein said correction signal increases the Q-value of the oscillating device by a factor of $(1+K_{FM} \times K_{vco})$ where $K_{FM}$=the gain of said FM detector and $K_{vco}$=the sensitivity of the controlled oscillating device.

19. A method according to claim 14, wherein said correction signal increases the Q-value of the oscillating device with a low-noise amplifier connected at the output of said FM detector by a factor of $(1+G_a \times K_{FM} \times K_{vco})$ where $G_a$=the gain of said low noise amplifier, $K_{FM}$=the gain of said FM detector and $K_{vco}$=the sensitivity of the oscillating device.

20. A method according to claim 14, further comprising the step of applying an external, slowly varying control signal to the oscillating device.

21. A method according to claim 14, wherein high frequencies are cut off at a frequency offset where an output spectrum of the oscillating device that is uncompensated reaches a noise floor.

22. A method according to claim 14, further comprising the step of increasing a loop gain by a low noise amplifier connected to the output of said FM detector so that the effective Q-value of the oscillating device is further increased.

23. A method for feeding back to an oscillating device comprising the steps of:
   (a) outputting an FM modulation signal by an oscillator; and
   (b) generating a loop gain by a negative FM feedback loop which suppresses noise in said FM modulation signal in proportion to said loop gain by directly compensating said oscillator, wherein said step (b) measures noise in said FM modulation signal by an FM detector and a loop gain is generated that is substantially zero in a predetermined frequency range by a filter connected to the output of said FM detector.

24. A method according to claim 23, wherein said step (b) suppresses undesired frequency variations by generating a correction signal directly from an output of said oscillator and applying said correction signal to said oscillator.

25. A method according to claim 23, wherein said step (b) increases the effective Q-value of said oscillator for a fixed resonance frequency.

26. A method according to claim 25, wherein the effective Q-value of said oscillator is increased by a factor of $(1+K_{FM} \times K_{vco})$ where $K_{FM}$=the gain of said FM detector and $K_{vco}$=the sensitivity of the controlled oscillator.

* * * * *